(12) United States Patent
Valcore, Jr. et al.

(10) Patent No.: US 8,797,705 B2
(45) Date of Patent: Aug. 5, 2014

(54) METHODS AND ARRANGEMENT FOR PLASMA DECHUCK OPTIMIZATION BASED ON COUPLING OF PLASMA SIGNALING TO SUBSTRATE POSITION AND POTENTIAL

(75) Inventors: John C. Valcore, Jr., San Jose, CA (US); Saurabh Ullal, San Francisco, CA (US); Daniel Byun, Newark, CA (US); Ed Santos, San Jose, CA (US); Konstantin Makhratchev, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 291 days.

(21) Appl. No.: 12/557,387

(22) Filed: Sep. 10, 2009

(65) Prior Publication Data

US 2011/0058302 A1    Mar. 10, 2011

(51) Int. Cl.
*H01L 21/683* (2006.01)
*H01T 23/00* (2006.01)
*H02H 1/00* (2006.01)

(52) U.S. Cl.
USPC .......................................... 361/234; 361/212

(58) Field of Classification Search
USPC ................................. 361/234, 212
See application file for complete search history.

(56) References Cited

U.S. PATENT DOCUMENTS

| | | | |
|---|---|---|---|
| 5,380,566 A * | 1/1995 | Robertson et al. ............ | 427/534 |
| 5,459,632 A | 10/1995 | Birang et al. | |
| 5,491,603 A | 2/1996 | Birang et al. | |
| 5,576,629 A | 11/1996 | Turner et al. | |
| 5,656,123 A | 8/1997 | Salimian et al. | |
| 5,684,669 A | 11/1997 | Collins | |
| 5,818,682 A | 10/1998 | Loo | |
| 6,307,728 B1 | 10/2001 | Leeser | |
| 6,578,423 B2 | 6/2003 | Fischer | |
| 7,137,352 B2 | 11/2006 | Yamashita et al. | |
| 7,141,757 B2 | 11/2006 | Hoffman et al. | |
| 7,196,896 B2 | 3/2007 | Howald et al. | |
| 7,864,502 B2 | 1/2011 | Boyd et al. | |
| 2002/0086546 A1 | 7/2002 | Yamashita et al. | |
| 2003/0038114 A1 | 2/2003 | Howald | |
| 2003/0210510 A1 | 11/2003 | Hann, Jr. et al. | |
| 2004/0159287 A1 | 8/2004 | Hoffman et al. | |
| 2006/0087793 A1 | 4/2006 | Kim et al. | |

(Continued)

OTHER PUBLICATIONS

"Non Final Office Action", U.S. Appl. No. 12/557,381, Mailing Date: Oct. 27, 2011.

(Continued)

*Primary Examiner* — Jared Fureman
*Assistant Examiner* — Lucy Thomas

(57) ABSTRACT

A method for optimizing a dechuck sequence, which includes removing a substrate from a lower electrode. The method includes performing an initial analysis to determine if a first set of electrical characteristic data of a plasma formed during the dechuck sequence traverses a threshold values. If so, turning off the inert gas. The method also includes raising the lifter pins slightly from the lower electrode to move the substrate in an upward direction. The method further includes performing a mechanical and electrical analysis, which includes comparing a first set of mechanical data, which includes an amount of force exerted by the lifter pins, against a threshold value. The mechanical and electrical analysis also includes comparing a second set of electrical characteristic data against a threshold value. If both traverse the respective threshold value, removes the substrate from the lower electrode since a substrate-released event has occurred.

20 Claims, 11 Drawing Sheets

(56) References Cited

U.S. PATENT DOCUMENTS

| | | | |
|---|---|---|---|
| 2007/0048882 A1 | 3/2007 | Kutney et al. | |
| 2007/0066064 A1 | 3/2007 | Kutney et al. | |
| 2008/0285202 A1 | 11/2008 | Boyd et al. | |
| 2010/0008015 A1 | 1/2010 | Booth et al. | |
| 2010/0208409 A1* | 8/2010 | Bluck et al. | 361/234 |

OTHER PUBLICATIONS

"International Search Report", PCT Application No. PCT/US2010/047382, Mailing Date: Apr. 26, 2011.

"Written Opinion", PCT Application No. PCT/US2010/047382, Mailing Date: Apr. 26, 2011.

"International Search Report", PCT Application No. PCT/US2010/047380, Mailing Date: Mar. 30, 2011.

"Written Opinion", PCT Application No. PCT/US2010/047380, Mailing Date: Mar. 30, 2011.

"International Preliminary Report on Patentability", PCT Application No. PCT/US2010/047380, Mailing Date: Mar. 22, 2012.

"International Preliminary Report on Patentability", PCT Application No. PCT/US2010/047382, Mailing Date: Mar. 22, 2012.

"Final Office Action", U.S. Appl. No. 12/557,381, Mailing Date: Jun. 14, 2012.

"Non Final Office Action", U.S. Appl. No. 12/557,381, Mailing Date: Dec. 24, 2012.

* cited by examiner

METHODS AND ARRANGEMENT FOR PLASMA DECHUCK OPTIMIZATION BASED ON COUPLING OF PLASMA SIGNALING TO SUBSTRATE POSITION AND POTENTIAL

CROSS REFERENCE TO RELATED APPLICATIONS

The present invention is related to the following application(s), all of which are incorporated herein by reference:

Commonly assigned application entitled "Methods and Arrangement For Detecting A Substrate-Released Event Within A Plasma Processing Chamber," U.S. patent application Ser. No. 12/557,381, filed on Sep. 10, 2009.

BACKGROUND OF THE INVENTION

Advances in plasma processing have facilitated growth in the semiconductor industry. In the competitive semiconductor industry, a manufacturer may gain a competitive edge if the manufacturer has the ability to maximize throughput and/or to produce quality devices at a lower cost. One method for controlling throughput is to control the dechuck sequence to optimize the substrate-release time.

During substrate processing, a substrate is usually clamped to a lower electrode (such as an electrostatic chuck). Clamping may be performed by applying a direct current (DC) potential to the lower electrode to create an electrostatic charge between the substrate and the lower electrode. To dissipate the heat on the substrate during substrate processing, an inert gas (such as helium) may be applied through various channels in the lower electrode to the backside of the substrate to improve the thermal heat transfer between the substrate and the lower electrode. Consequently, due to the helium pressure on the substrate, a relatively high electrostatic charge is required to clamp the substrate to the lower electrode.

Once substrate processing has been completed within the processing chamber, a dechuck sequence is performed in which the clamping voltage is turn off. Even though the clamping voltage is set to zero, a residual electrostatic force remains due to the electrostatic charge between the substrate and the lower electrode. To discharge the electrostatic charge between the substrate and the lower electrode, a low density plasma may be generated to neutralize the attraction force between the substrate and the lower electrode. Once the electrostatic charge has been removed, lifter pins disposed within the lower electrode may be raised to lift the substrate upward to separate the substrate from the surface of the lower electrode, thereby allowing a robot arm to remove the substrate from the plasma processing chamber.

If the electrostatic charge has not been satisfactorily removed, partial sticking may exist resulting in partial substrate hinging to the surface of the lower electrode, thereby causing part of the substrate to break apart when the lifter pins is pushed upward from the lower electrode. The partial sticking may not only damage the substrate but the debris caused by substrate cracking may also require the plasma processing system to be taken offline for chamber cleaning.

In addition, if the electrostatic charge has not been satisfactorily discharged, enough charge may still exist on the substrate to cause arcing between the substrate and the robot arm when the robot arm tries to remove the substrate from the processing chamber. Arcing is an uncontrolled event that may cause undesirable results, such as damage to devices on the substrate and/or the robot arm.

Additionally and/or alternatively, a small voltage biased in the opposite charge of the clamping voltage may be applied to the lower electrode to facilitate dechucking. In an example, if the clamp voltage is 10 volts, then a voltage charge of −1 volt may be applied to the lower electrode during the dechuck sequence. The application of a clamped voltage in the opposite charge causes the positive charge to flow toward the negative charge to aid in the neutralization of the electrostatic force between the substrate and the lower electrode.

Given that the processing environment may vary depending upon the type of processing system, the type of processing modules, the substrate structures, the recipe, and the likes, the time period for executing a successful dechuck sequence may vary. Since the application time period is unknown beforehand and the consequences for improper dechucking are severe, the tendency is to apply the dechuck sequence for a conservatively long specified time period in order to ensure that there is sufficient time for the electrostatic charge to be sufficiently discharged. Unfortunately, both methods of dechucking (at zero volts and at a bias voltage of reverse polarity) still do not always provide a safe and efficient manner of releasing the substrate.

In some cases, the electrostatic charge may be such that only a minimal amount of time is required to discharge. However, the specified time period method does not provide an early-detection method for identifying when the substrate may be safely removed from the lower electrode. As a result, throughput is negatively impacted as time is wasted while the unhinged substrate remains in the processing chamber for the entire specified time period before the unhinged substrate may be removed from the chamber. Also, the existence of the dechuck plasma in the processing chamber for the additional (and unnecessary) time may also contribute to the premature degradation of the chamber components and/or unwanted etching of the substrate.

In other cases, the electrostatic charge may not have been sufficiently discharged after the specified time period has elapsed. As a result, the attempt to remove the hinged substrate may cause the substrate to break. Even if the substrate does not crack, the remaining residual electrostatic charge on the substrate may cause the pneumatic lift mechanism to exert a large force on the lifter pins in order to separate the substrate from the lower electrode. Accordingly, the force exerted on the substrate may cause the substrate to shift away from the process center, thereby causing the substrate to be improperly aligned for the next recipe step. In addition, the residual electrostatic charge on the substrate may cause arcing between the substrate and the robot arm, thereby causing damage to the devices on the substrate and/or the robot arm.

Instead of just executing the dechuck sequence for a specified period of time, certain mechanical parameters (such as inert gas flow, inert gas pressure, and lifting pin force) may be monitored to aid in determining when a substrate may be deemed to have been separated from the lower electrode. In an example, if the inert gas flow (e.g., helium gas flow) to the backside of the substrate exceeds a predetermined threshold, the electrostatic charge is considered to be sufficiently discharged and the substrate may be removed from the processing chamber. In another example, if the inert gas pressure falls below a predetermined threshold, the electrostatic charge is considered to be discharged. Likewise, if the lifting pin force falls below a predetermined threshold value, the substrate is considered to be sufficiently discharged. However, if any of the threshold values is not traversed, then the electrostatic charge is deemed to have been insufficiently discharged and the mechanical forces and/or the bias voltage/current in the opposite charge may be adjusted.

However, the aforementioned methods tend to be time consuming and cumbersome. For example, in one case, only one or two parameters may be adjusted at any one point in time since adjusting too many parameters at once may cause an uncontrolled dechuck sequence.

Since the amount of electrostatic charge due to the clamping voltage may vary depending upon a number of factors (such as the type of lower electrode, the recipe, the process module, and the like), a high degree of variability may exist. Given the high degree of variability, monitoring based on mechanical values (such as helium flow, induced pressure, and or force of lifter pins) is insufficient in optimizing the dechuck sequence since the mechanical values do not accurately and/or adequately characterize the actual electrostatic charges between the substrate and the lower electrode. In an example, one of the mechanical values (such as inert gas flow, inert gas induced pressure, and/or lifter pin force) indicates that a predetermined threshold value (the value that has been designated at which the substrate may be safely released from the lower electrode) has been traversed; however, the electrostatic charge may be nonuniform across the surface of the substrate. Thus, isolated pockets may exist in which the electrostatic charge has not been sufficiently removed. As a result, isolated hinging may still occurs resulting in damage to the substrate when the substrate is separated from the lower electrode.

In addition, since none of the monitored mechanical values accurately characterizes the actual electrostatic charge between the substrate and the lower electrode, a residual amount of charge may still exist on the substrate even though the substrate may be successfully lifted from the lower electrode. As a result, arcing may still occur between the substrate and the robot arm, resulting in damages to devices on the substrate and/or the robot arm.

In view of the foregoing, there are desired improved techniques for optimizing the dechuck sequence.

BRIEF SUMMARY OF THE INVENTION

The invention relates, in an embodiment, to a method for optimizing a dechuck sequence, which includes mechanically removing a substrate from a lower electrode in a processing chamber of a plasma processing system. The method includes performing an initial analysis. The initial analysis includes analyzing a first set of electrical characteristic data of a plasma, wherein the plasma is formed over the substrate during the dechuck sequence. The initial analysis also includes comparing the first set of electrical characteristic data against a set of electrical characteristic threshold values. The initial analysis further includes, if the first set of electrical characteristic data traverses the set of electrical characteristic threshold values, turning off inert gas. The method also includes raising the lifter pins from the lower electrode to move the substrate in an upward direction, wherein the lifter pins are not raised to a maximum height. The method further includes performing a mechanical and electrical analysis. The mechanical and electrical analysis includes analyzing a first set of mechanical data, wherein the set of mechanical data includes an amount of force exerted by the lifter pins. The mechanical and electrical analysis also includes analyzing a second set of electrical characteristic data. The mechanical and electrical analysis further includes comparing the first set of mechanical data to a set of mechanical threshold values and the second set of electrical characteristic data to the set of electrical characteristic threshold values. The mechanical and electrical analysis yet also includes, if the first set of mechanical data traverses the set of mechanical threshold values and the second set of electrical characteristic data traverses the set of electrical characteristic threshold values, removing the substrate from the lower electrode since a substrate-released event has occurred.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
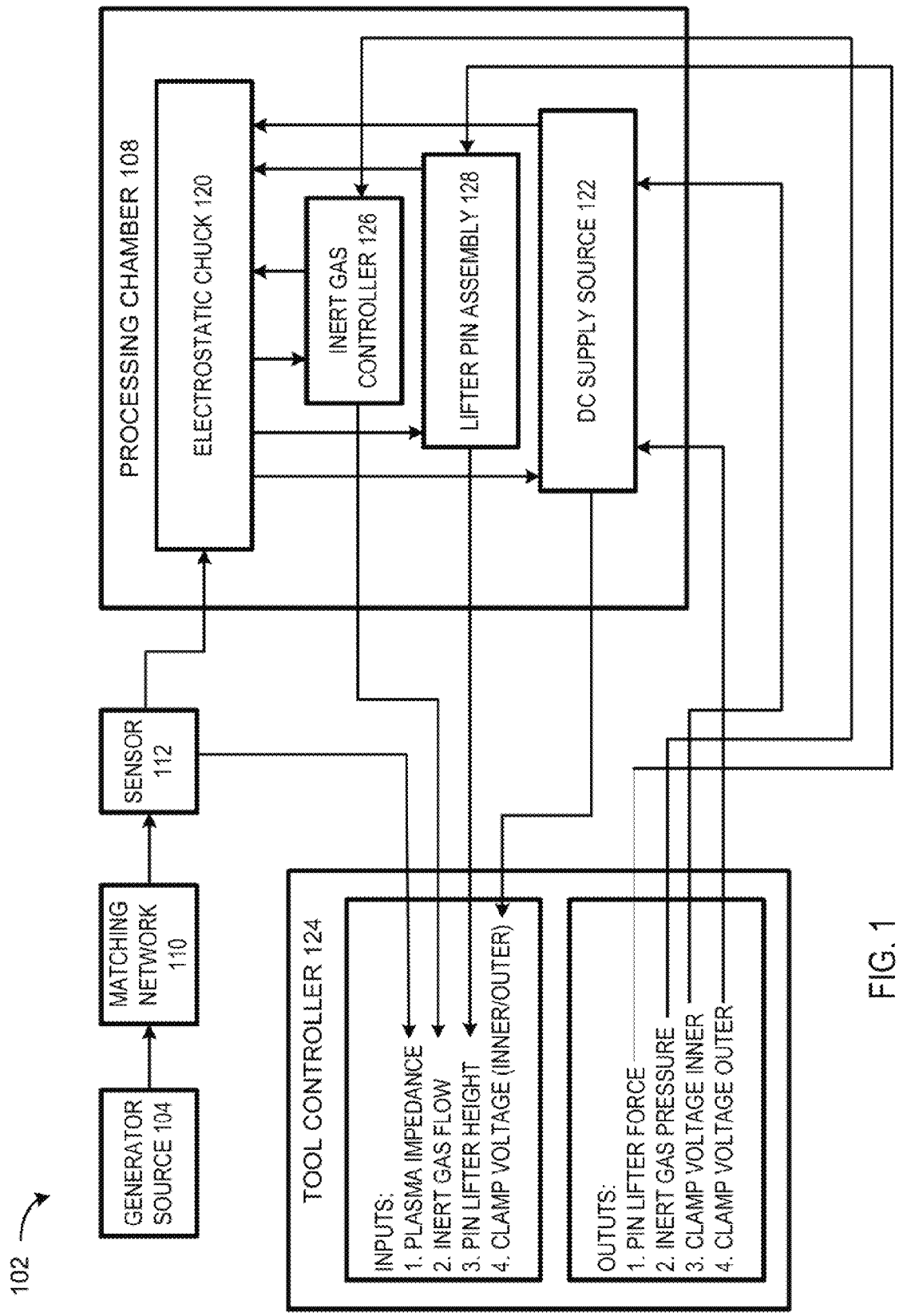
FIG. 1 shows, in an embodiment of the invention, a simple logical block diagram of a processing environment with an optimizing dechuck control scheme.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the present invention, methods for optimizing the dechuck sequence are provided. Embodiments of the invention include monitoring electrical signals and mechanical forces to determine when the substrate may be safely separated from the lower electrode. Embodiments of the invention also incorporate both electrical and mechanical forces to facilitate the dissipation of the electrostatic charges between the substrate and the lower electrode. Embodiments of the invention further include methods for identifying conditions for applying corrective actions to facilitate a successful substrate-release event.

In this document, various implementations may be discussed using plasma impedance as an example. This invention, however, is not limited to plasma impedance and may include any electrical parameter that may exists during the dechuck event. Instead, the discussions are meant as examples and the invention is not limited by the examples presented.

In an embodiment of the invention, methods are provided for identifying the optimal time to safely separate the substrate from the lower electrode by observing electrical signals and/or mechanical forces. Consider the situation wherein, for example, a dechuck sequence is initiated. Unlike the prior art, the dechuck sequence is not performed for a specified time period. Also, unlike the prior art, the separation of the substrate from the lower electrode is not dependent only upon feedbacks from mechanical forces (such as inert gas flow, inert gas pressure, and lifting pin force). Instead, the dechuck sequence is aided by monitoring both mechanical and electrical parameters. The parameters include mechanical forces (such as inert gas flow, inert gas pressure, and lifting pin force), electrical parameters that drive the plasma and electrical parameters applied to the lower electrode. By monitoring the aforementioned parameters, the substrate potential and the substrate position in relation to the lower electrode may be ascertained to determine when the substrate may be safely be removed from the lower electrode.

In an embodiment, the monitoring of the mechanical forces and the electrical signals are performed in a continuum. Accordingly, problems (such as localized hinging of the substrate to the lower electrode) that may arise during the dechuck sequence may be identified and appropriate corrective actions may be applied to correct the problems.

The features and advantages of the present invention may be better understood with reference to the figures and discussions that follow.

FIG. 1 shows, in an embodiment of the invention, a simple logical block diagram of a processing environment with an optimized dechuck control scheme. A plasma processing system 102 includes a generator source 104, which is configured to provide power to a processing chamber 108 via a matching network 110.

Processing chamber 108 may include an electrostatic chuck 120 (i.e., lower electrode). During substrate processing, a substrate (not shown) is typically clamped to electrostatic chuck 120. Clamping may be performed by applying direct current (DC) potential via a DC supply source 122 to create an electrostatic charge between the substrate and electrostatic chuck 120. To improve the thermal conduction between the substrate and electrostatic chuck 120, an inert gas (such as helium) is applied to the backside of the substrate through various channels (not shown) in electrostatic chuck 120. Thus, clamping is an important component of substrate temperature control since proper clamping permits helium cooling of the backside of the substrate to be properly controlled. However, due to the induced pressure caused by the inert gas, a relatively high clamp voltage is required to create a sufficiently strong attraction force between the substrate and electrostatic chuck 120.

Once substrate processing has been completed, a dechuck sequence may be executed to discharge the electrostatic charge between the substrate and electrostatic chuck 120. Usually, the dechuck sequence includes turning off the clamping voltage and generating a low-powered plasma to neutralize the electrostatic charge without etching the substrate.

In the prior art, the monitoring method includes observing mechanical parameters (such as helium flow, induced pressure, force exerted by the lifter pins, and the likes) that may affect the separation of the substrate from electrostatic chuck 120. However, the mechanical parameters (such as helium flow, induced pressure, and lifter pin force) do not accurately characterize the electrostatic forces between the substrate and electrostatic chuck 120.

In an embodiment, methods are provided for monitoring electrical parameters (in addition to the mechanical parameters) that may provide insights into one or more characteristics (substrate movement relative to electrostatic chuck 120, electrostatic charge spatial uniformity, and substrate potential) of the electrostatic charge. Also, unlike the prior art, the parameters are measured on a continuum to identify not only when the electrostatic charge has been sufficiently discharged but to identify when corrective actions are required to be applied to facilitate the dechuck sequence.

In order to provide an optimal dechuck control scheme, a tool controller 124 may be receiving processing data from a plurality of sources. As can be appreciated, the processing data may be either in an analog or a digital format. In an embodiment, tool controller 124 may be receiving voltage and current data from a sensor 112. With the voltage and current data, plasma impedance may be determined. The plasma impedance is monitored since the plasma impedance reflects the electrical characteristic of the plasma when physical perturbations in the substrate cause oscillations in the plasma. The physical perturbations may be due to the main electrostatic force being removed. The physical perturbations may also be due to an increased volume between the substrate and the surface of electrostatic chuck 120 due to mechanical forces (such as the lifter pins being raised from electrostatic chuck 120). In addition, the physical perturbations may be due to the final separation of the substrate from electrostatic chuck 120.

In an embodiment, tool controller 124 may also be receiving data about inert gas (e.g., helium) flow between the substrate and electrostatic chuck 120 from an inert gas controller 126. Tool controller 124 may also be receiving data about the lifter pin height from the pneumatic lifter pin assembly 128. Additionally, tool controller 124 may be receiving data about bias voltage/current from DC supply source 122.

With the continuous flow of data coming in from the various data sources, tool controller 124 is able to monitor the parameters on a continuum basis. In an embodiment, the data collected may be analyzed in order to determine when the substrate can be lifted from electrostatic chuck 120 and remove from processing chamber 108. Additionally or alternatively, the data collected may be analyzed in order to determine when corrective actions may be required. In an example, the electrostatic charge across the surface of the substrate may not be uniformed. In an embodiment, tool controller 124 may instruct DC supply source 122 to apply additional bias voltage/current in the opposite charge to one or more pole of electrostatic chuck 120 in order to facilitate the neutralization of electrostatic charge in the localized region that may not have been sufficiently discharged. In another example, if additional inert gas pressure is required based on the data being analyzed, additional inert gas pressure may be applied to unhinge the substrate from electrostatic chuck 120.

Figure 2:
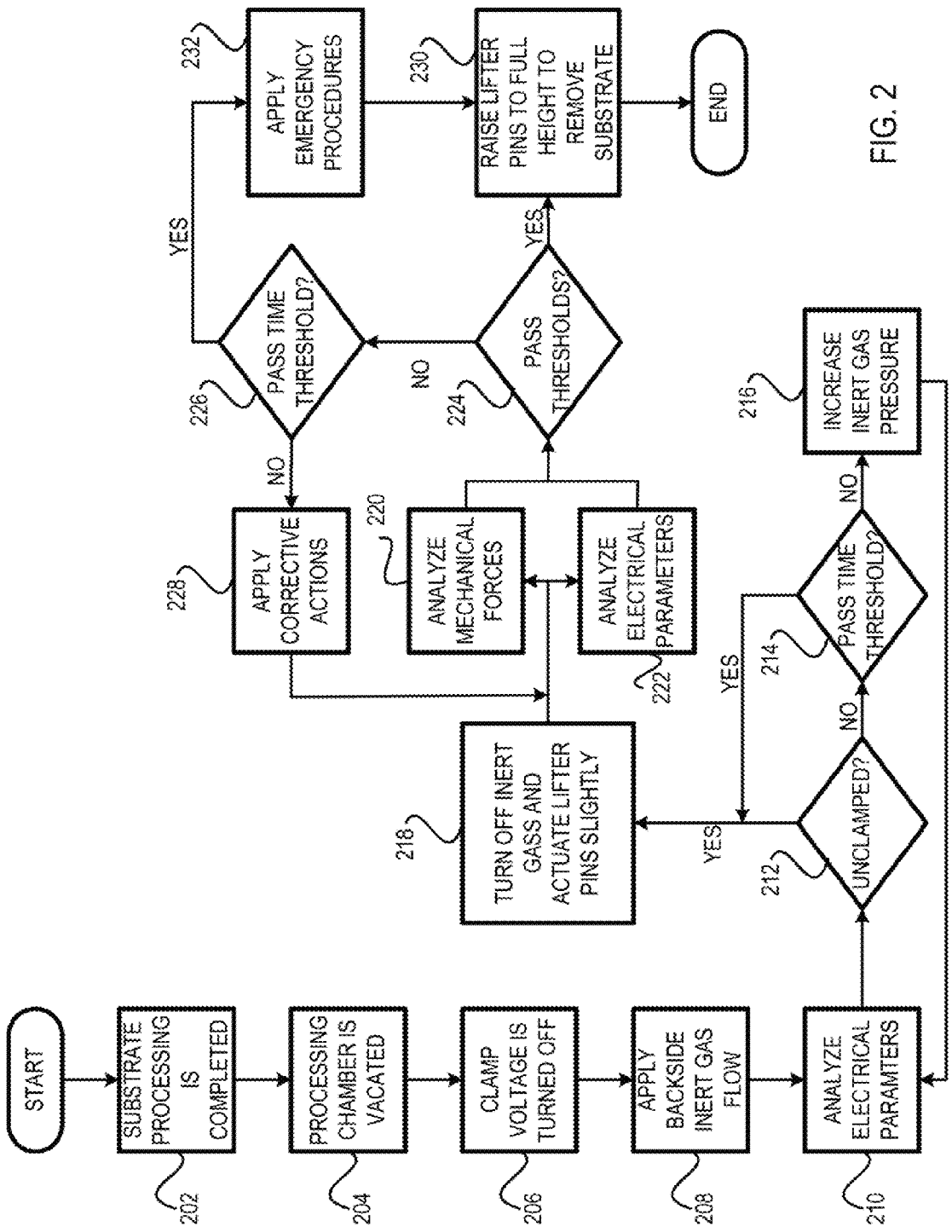
FIG. 2 shows, in one embodiment of the invention, a simple flow chart for optimizing the dechuck control sequence.

FIG. 2 shows, in one embodiment of the invention, a simple flow chart for optimizing the dechuck control sequence.

At a first step 202, substrate processing is completed. Consider the situation wherein for example, the substrate is being etched within processing chamber 108. Once the main etch has been completed, the substrate is ready to be dechucked and removed from processing chamber 108. To begin the dechuck sequence, the power (such as the power being provided by generator source 104) is ramped down. Accordingly, a low-powered plasma may be formed to neutralize the electrostatic charge on the substrate.

At a next step 204, the processing chamber is vacated (wafer backside inert gas). In other words, the high pressure (of about 20-30 torrs, in one example) employed during substrate processing is pumped out of processing chamber 108.

At a next step 206, the clamp voltage is turned off. The clamp voltage is the DC potential that is applied by DC supply source 122 to electrostatic chuck 120 to create the electrostatic charge on the substrate. By turning off the clamp voltage the DC potential is set to zero.

At a next step 208, the backside inert gas flow is applied to the substrate. As aforementioned, inert gas (such as helium) is applied to the backside of the substrate during substrate processing to enable thermal heat transfer between the substrate and electrostatic chuck 120. In order to hold the substrate steady during substrate processing (especially with the inert gas flow being applied to the backside of the substrate), clamp voltage may be applied to electrostatic chuck 120 to clamp the substrate to electrostatic chuck 120. Thus, when the clamp voltage is set to zero voltage (at step 206), the backside inert gas flow causes the substrate to separate from electrostatic chuck 120 since the clamp voltage is no longer available to maintain the electrostatic force between the substrate and electrostatic chuck 120.

Figure 3:
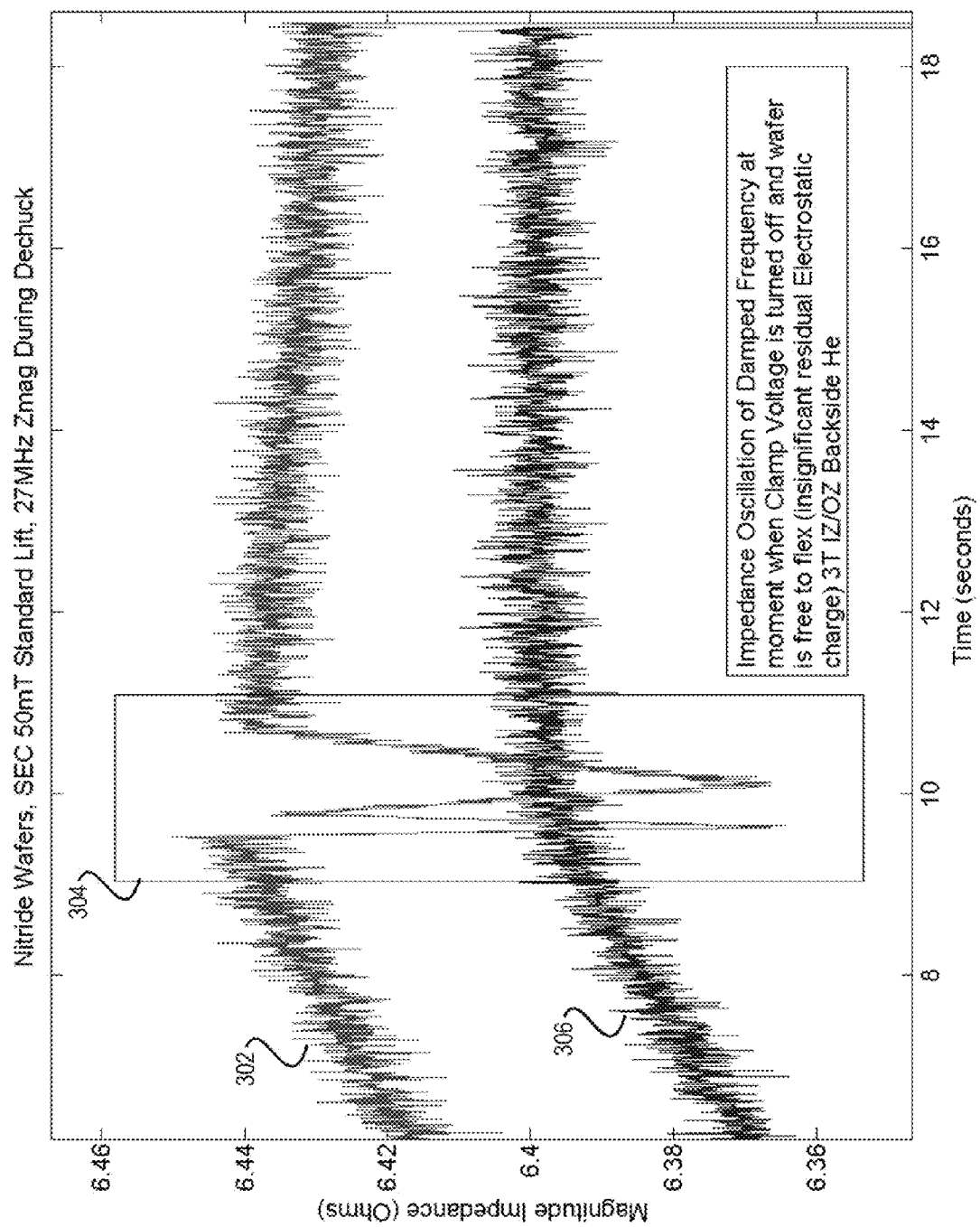
FIG. 3 shows, in an embodiment of the invention, a simple plasma impedance plot.

When the clamp voltage is turned off, the substrate may flex back to its natural state. The flexing of the substrate may cause an oscillation in the plasma which may be reflected in the change to the electrical characteristic of the plasma. Referring to FIG. 3, a simple plasma impedance plot is provided, in an embodiment. Plot line 302 shows the plasma impedance after the clamp voltage has been turned off. As can be seen at point 304, a perturbation is shown in the plasma impedance of the plasma when the DC potential is set to zero. In other words, when the clamp voltage is turned off, the substrate may flex as it returns to its natural state. The flexing of the substrate may cause an oscillation into the plasma that may translate as a change in the electrical characteristic of the plasma (such as plasma impedance).

However, it is possible that the plasma impedance may not show any change. In an example, if a relatively high electrostatic charge is required to clamp the substrate to electrostatic chuck 120 during substrate processing, the removal of the clamp voltage may not cause a perturbation in the plasma impedance given that a high residual electrostatic charge may remain (as shown by plot line 306). Accordingly, embodiments of the invention provide for monitoring and analysis of more than one electrical parameter to remove the potential for false positives.

Referring back to FIG. 2, at a next step 210, one or more electrical parameter is analyzed. Examples of electrical parameters include plasma impedance, DC bias voltage/current, generator power, and the likes. The data about the electrical parameters may be captured by sensor 112 (such as a voltage/current probe) and sent to tool controller 124 for analysis.

At a next step 212, the processing data is compared against a set or threshold values. If the processing data does not traverse a set of threshold values, the electrostatic charge is not considered to be sufficiently discharged. In an embodiment, a single electrical parameter (such as plasma impedance) may be compared to a predetermined threshold value. In another example, a combination of electrical parameters may be compared to a set of threshold values. As can be appreciated from the foregoing, comparison criteria may be established in which certain combinations of electrical signatures have to be traversed before the electrostatic charge is considered to be successfully discharged.

As discussed herein, the term traverse may include exceed, fall bellow, be within range, and the like. The meaning of the word traverse may depend upon the requirement of the threshold value/range. In an example, if the recipe requires the plasma impedance, for example, to be at least a certain value, then the processing data is considered to have traversed the threshold value/range if the plasma impedance value has met or exceed the threshold value/range. In another example, if the recipe requires the plasma impedance, for example, to be below a value, then the processing data has traversed the threshold value/range if the plasma impedance value has fallen below the threshold value/range.

At a next step 214, a time check is performed. Accordingly, the time check refers to the amount of time allowed by a recipe for the dechuck sequence. Since each recipe may differ, the time threshold value may vary with each recipe. In an example, if the dechuck sequence for recipe 1 is allotted 5 seconds, then the threshold value may be set to 3 seconds. However, if the dechuck sequence for recipe 2 is allotted 10 seconds, then the threshold value may be set to a higher threshold. As can be appreciated from the foregoing, the threshold values may be theoretically or empirically calculated.

If the time remaining is greater than a time threshold value, then at a next step 216, the inert gas parameter is adjusted, in an embodiment. In an example, the gas pressure may be increased. After the inert gas flow has been adjusted, the system may return to step 210 to analyze the recently collected electrical parameter processing data. In an embodiment, if the inert gas pressure and/or gas flow is beyond a predetermined threshold value, then the inert gas pressure/flow is not adjusted given that too much adjustment in the inert gas pressure/flow may result in an uncontrolled dechuck event that may damage the substrate and/or chamber components.

The aforementioned steps are iterative steps that may be repeated until the comparison (at step 212) indicates that the set of threshold values has been traversed or time has run out (at step 214). At that point, the system proceeds to a next step 218.

At step 218, the inert gas flow is turn off and the pneumatic lift mechanism raises the lifer pins slightly (wherein the lifter pins are not raised to its maximum height). In other words, the lifter pins are no longer fully embedded within electrostatic chuck 120. Instead, the slight upward movement of the lifter pins provides processing data about the force exerted to be captured and sent to tool controller 124 for analysis.

At a next step 220, the force exerted is measured and compared against a threshold value. Consider the situation wherein, for example, the monitored force due to the lifter pins is below a threshold value. Unlike the prior art, the inventive method does not consider the force of the lifter pins being below a threshold value as an indicator that the electrostatic charge has been sufficiently discharged to safely remove the substrate.

Instead, not only is the mechanical force analyzed but also the electrical parameters are examined (step 222), in an embodiment. In an example, a single electrical parameter (such as plasma impedance) may be compared against a threshold value. In another example, a combination of electrical parameters (such as plasma impedance and generator power) is compared against a set of threshold values.

If one or both parameters (force and set of electrical parameters) does not pass the comparison test (step 224), then the lifter pins are not extended to their full height since the electrostatic charge is not considered as sufficiently discharged. Instead, at a step 226, a time check is performed.

If sufficient time remains, corrective actions may be performed at a next step 228. Corrective actions may include increasing the inert gas pressure. Note that if the inert gas pressure has already reached a predetermined threshold, additional pressure is not applied. Another corrective action may include increasing the force on the lifter pins. Yet another corrective action may include applying a bias voltage/current of reverse polarity to lower electrode 108.

In an embodiment, instead of applying the corrective action uniformly across the surface of the substrate, the corrective action may be applied locally. In other words, if isolated regions of the substrate are still hinged to lower electrode, the corrective action may be applied to that isolated regions. In an example, electrostatic chuck 120 may be a bipolar electrostatic chuck. The processing data indicates that the substrate region around pole 1 still have to much residual electrostatic charge. Thus, a higher bias voltage/current in the opposite charge may be applied to pole 1 to facilitate in the neutralization of the electrostatic charge in that area.

As can be appreciated from the foregoing, the method of selectively applying corrective action substantially minimizes the possibility of the substrate being exposed to unnecessary processing. In an example, if all but a small region of the substrate is unhinged, applying a higher bias voltage across the entire surfaced of the substrate may cause "damage" to the substrate. However, if only the region that needs to be unhinged receives the corrective action, the corrective action is applied toward the process of dechucking the substrate instead of being applied toward non-productive or even damaging action.

Steps 220 through 228 are iterative until the comparison (step 224) indicates that the set of threshold values has been traversed and that the substrate may be safely separated from the lower electrode (step 230) or time has run out (at step 226).

If time has run out at step 226, then at a next step 232, emergency procedures may be implemented. Emergency procedures may vary depending upon the recipe. In one example, an emergency procedure may include sending an alarm notification about the pending dechucking problem. In another example, human intervention may be required to resolve the dechucking problem. Although the preservation of the integrity of the substrate is desirable, the emergency procedure may include exerting a high amount of force by the pneumatic lift mechanism to separate the substrate from the lower electrode in order to remove the substrate from the processing chamber. The requirement for certain emergency procedures may also be an indication that chamber maintenance may be required to reset the chamber.

As can be appreciated from FIG. 2, the innovative methods provide an optimization dechucking control scheme. By monitoring electrical and mechanical values, the optimal time for a substrate-release event is not only identified but may also be aided. Accordingly, unlike the prior art, time is not wasted while the unhinged substrate remains in the processing chamber for a specified time period. Further, the potential for false positive is substantially eliminated since the substrate-release event is based on mechanical values and electrical characteristics of the plasma. In addition, the dechuck sequence may be aided by adjusting certain mechanical and/or electrical parameters if the dechuck sequence is not proceeding in a timely manner.

Figure 4:
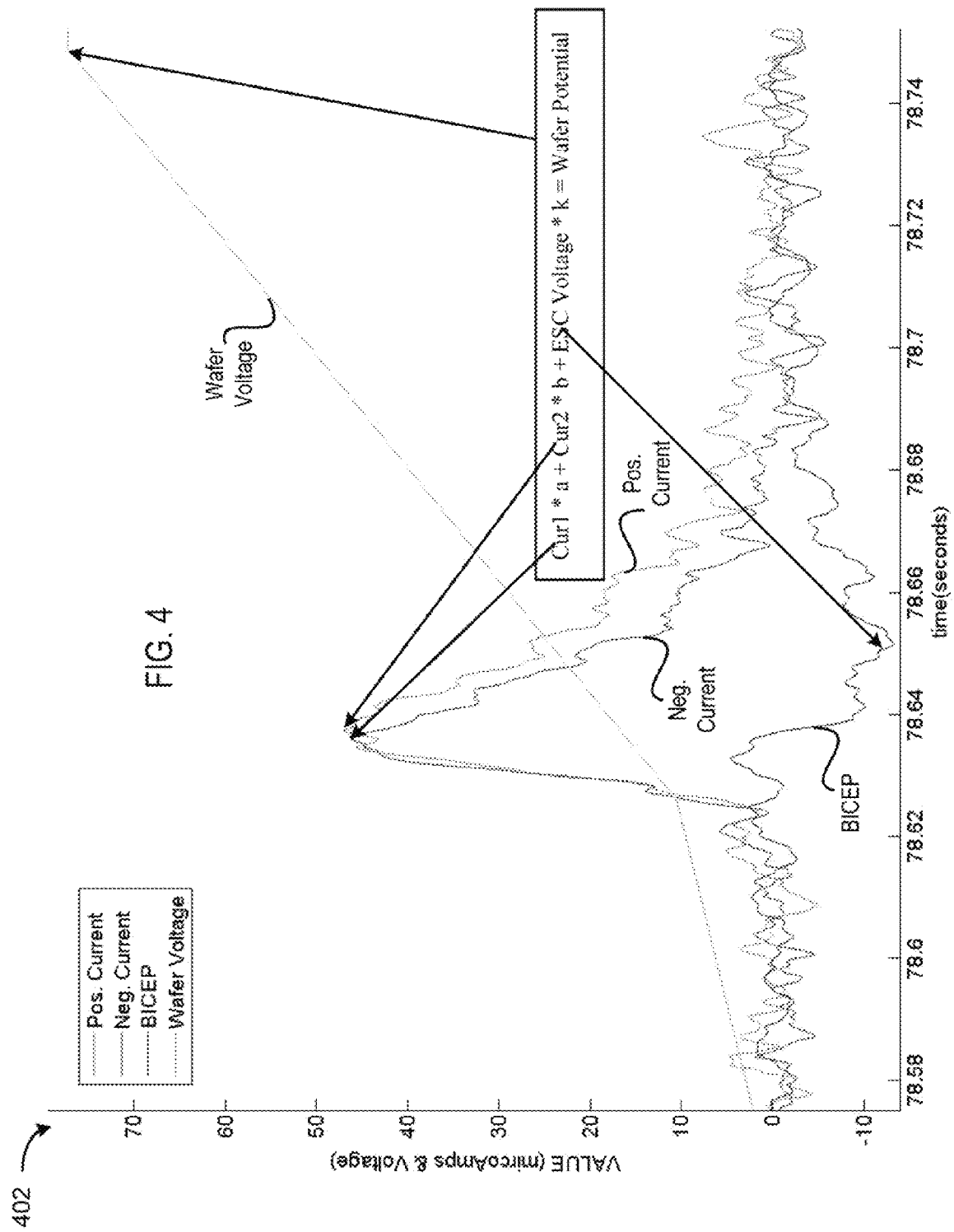
FIG. 4 shows, in an embodiment of the invention, a plot illustrating the relationship between a substrate potential and a bias voltage/current of a lower electrode when lifter pins are at full height.

To validate the relationship between bias voltage/current with the physical perturbations exhibit by the substrate, an empirical model was created in which a test substrate was monitored during a dechuck sequence. FIG. 4 shows, in an embodiment of the invention, a plot 402 illustrating the relationship between the substrate potential and the bias voltage/current of the lower electrode when the lifter pins are at full height. By identifying the factors (such as current, voltage, etc.) affecting the substrate potential, the same substrate potential model may be applied in production to determine when corrective actions are required.

Figure 5A:
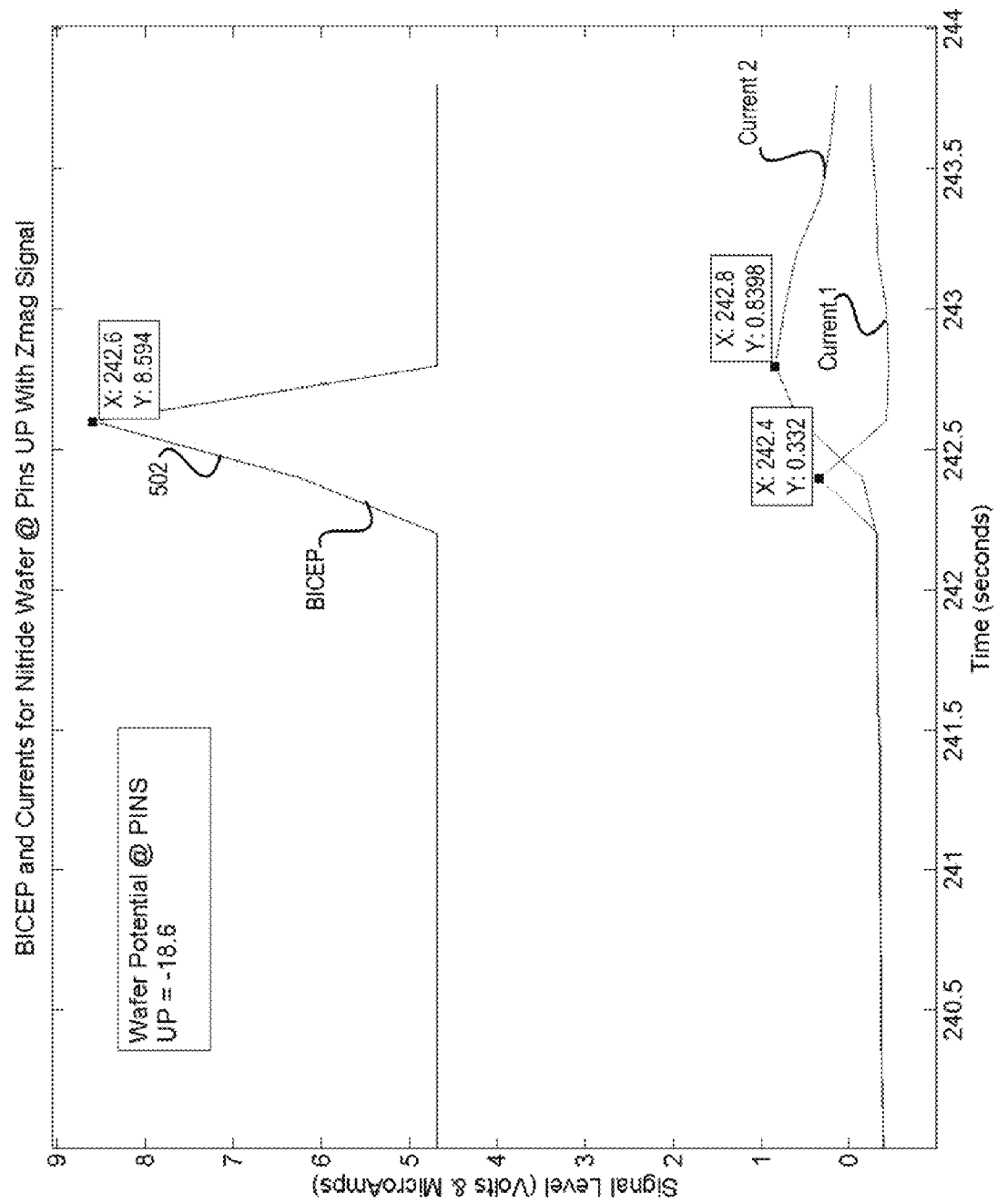
FIGS. 5A and 5B show, in embodiments of the invention, comparison between substrate potential and plasma impedance when the lifter pins are extended to full height.
Figure 5B:
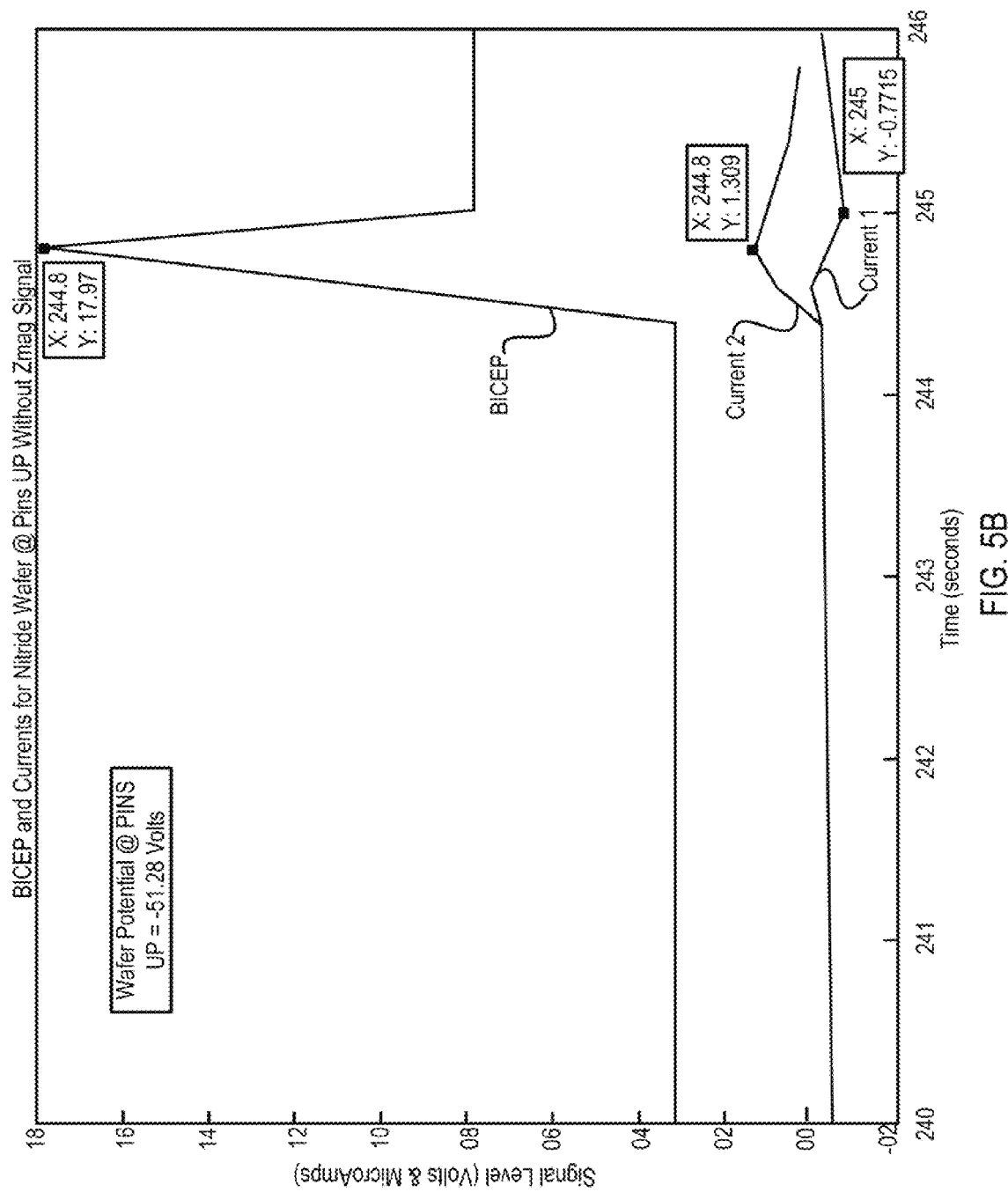

FIGS. 5A and 5B show, in embodiments of the invention, comparison between substrate potential and plasma impedance when the lifter pins are extended to full height. The plots show that the substrate with no impedance signal has a higher substrate potential (plot 306 from FIG. 3 correlates to FIG. 5B) than the substrate with an impedance signal (plot 302 from FIG. 3 correlates to FIG. 5A). In other words, the substrate in plot 306 has a higher residual electrostatic charge then the substrate in plot 302 when the substrate has been separated from the lower electrode. As a result, the substrate with the higher potential (plot 306) may not dechuck properly.

Figure 6A:
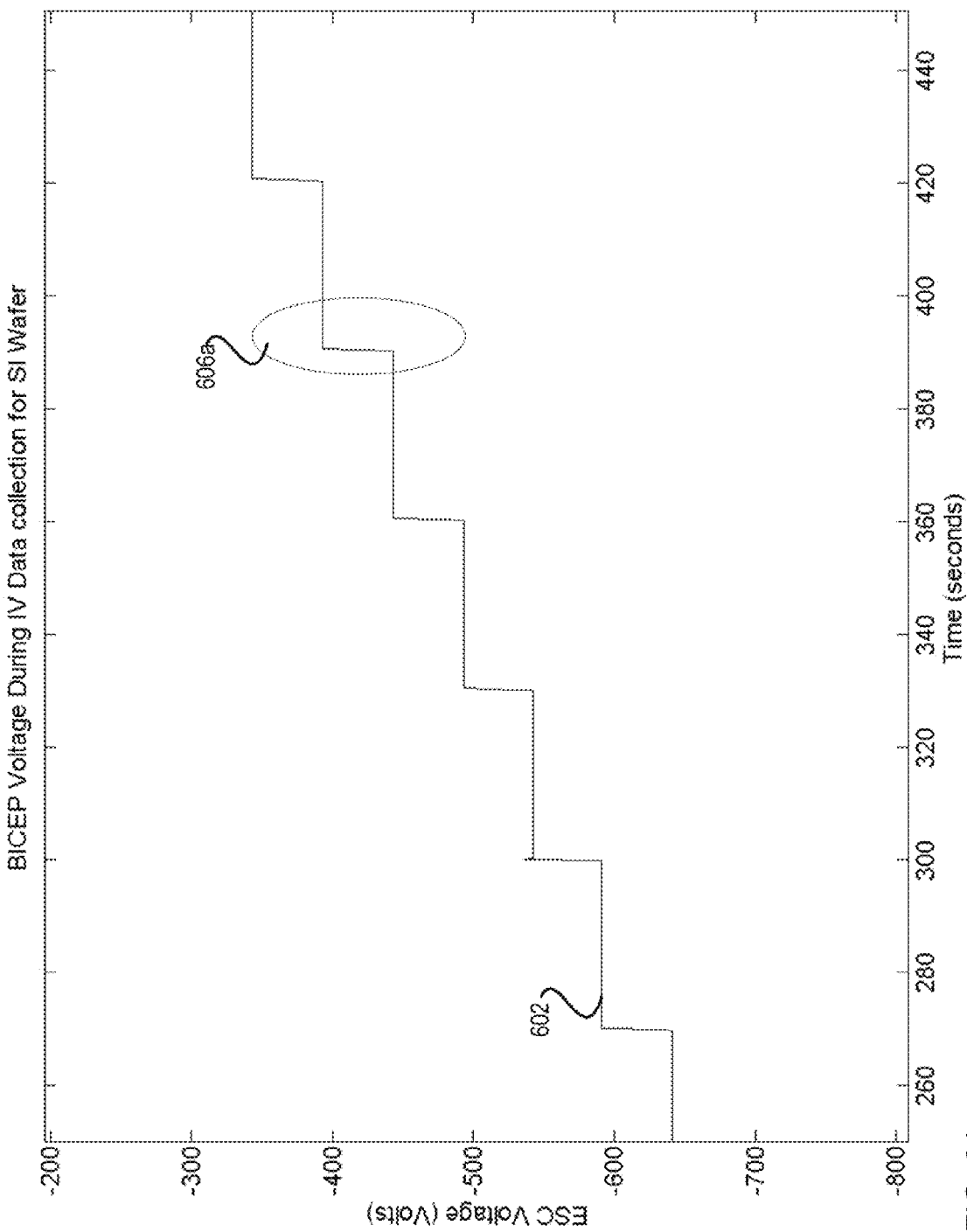
FIGS. 6A and 6B show, in embodiments of the invention, comparisons between bias voltage and plasma impedance.
Figure 6B:
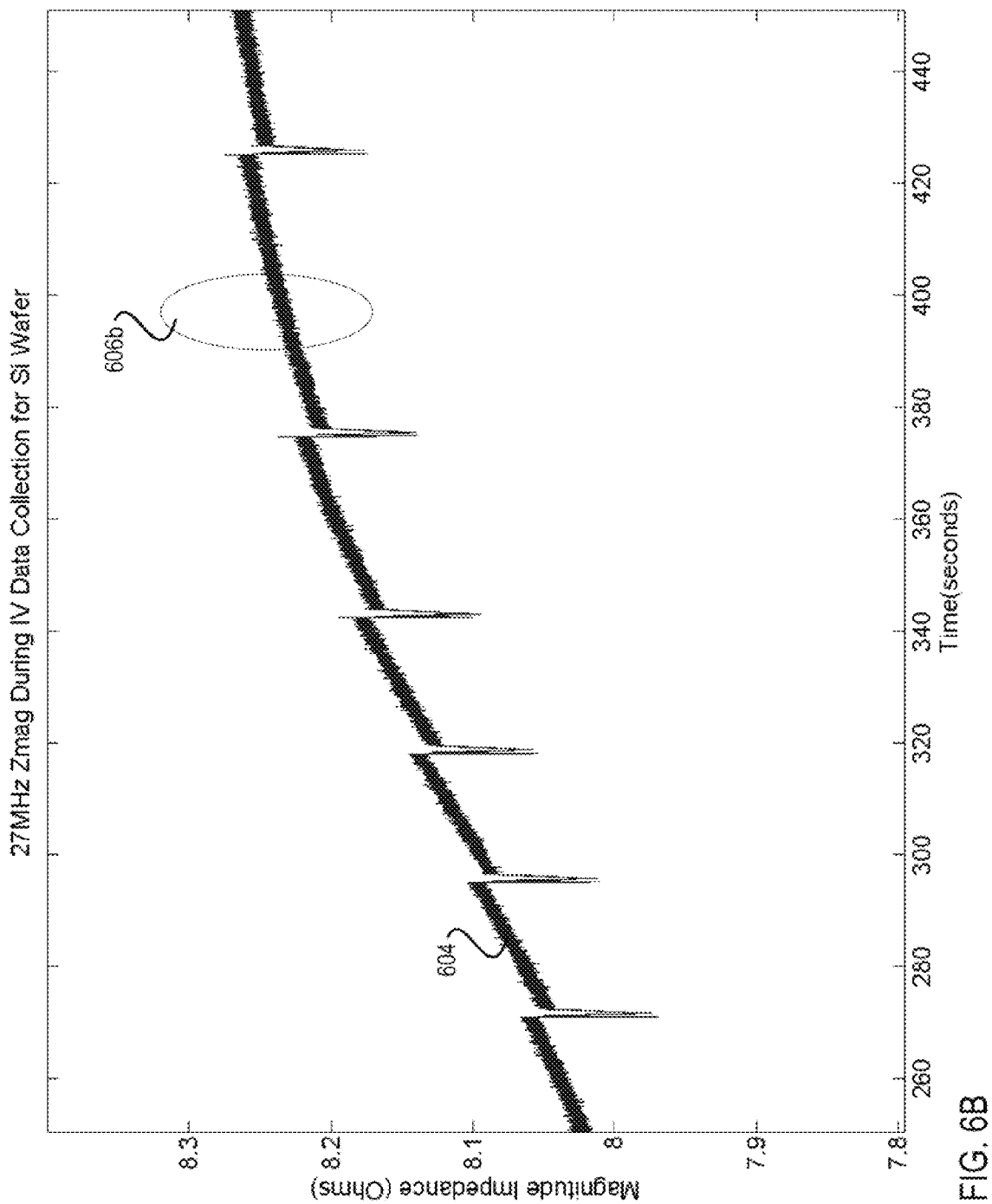

FIGS. 6A and 6B show, in embodiments of the invention, comparisons between bias voltage and plasma impedance. As aforementioned, by applying a bias supply (either voltage or current) with a reverse polarity, the electrostatic force between a substrate and a lower electrode is reduced. Consider the situation wherein, for example, the clamp voltage applied to create an electrostatic charge between the substrate and the lower electrode during substrate processing has a positive charge. By applying a bias voltage with a lower potential, the electrostatic force is reduced, thereby enabling the substrate to exhibit physical perturbations. The physical perturbations cause oscillations in the plasma. The oscillations are captured as changes to the plasma impedance.

Plot 602 shows an increase in the bias voltage as a function of time (as shown in FIG. 6A). Plot 604 shows the corresponding plasma impedance as a function of time (as shown in FIG. 6B). For each increase in the bias voltage on plot 602, a corresponding perturbation is shown in the plasma impedance on plot 604. Thus, the change in the bias voltage has a corresponding change in the plasma impedance.

Although plasma impedance usually reflects substrate movement, situations may arise when a change in the bias voltage is not reflected as a change in the plasma impedance. In an example, at around 400 seconds (section 606a and 606b), bias voltage is changed; however, a corresponding change is not reflected in the plasma impedance plot. As a result, the inventive method provides for monitoring of multiple electrical parameters to account for potential false positives.

Figure 7:
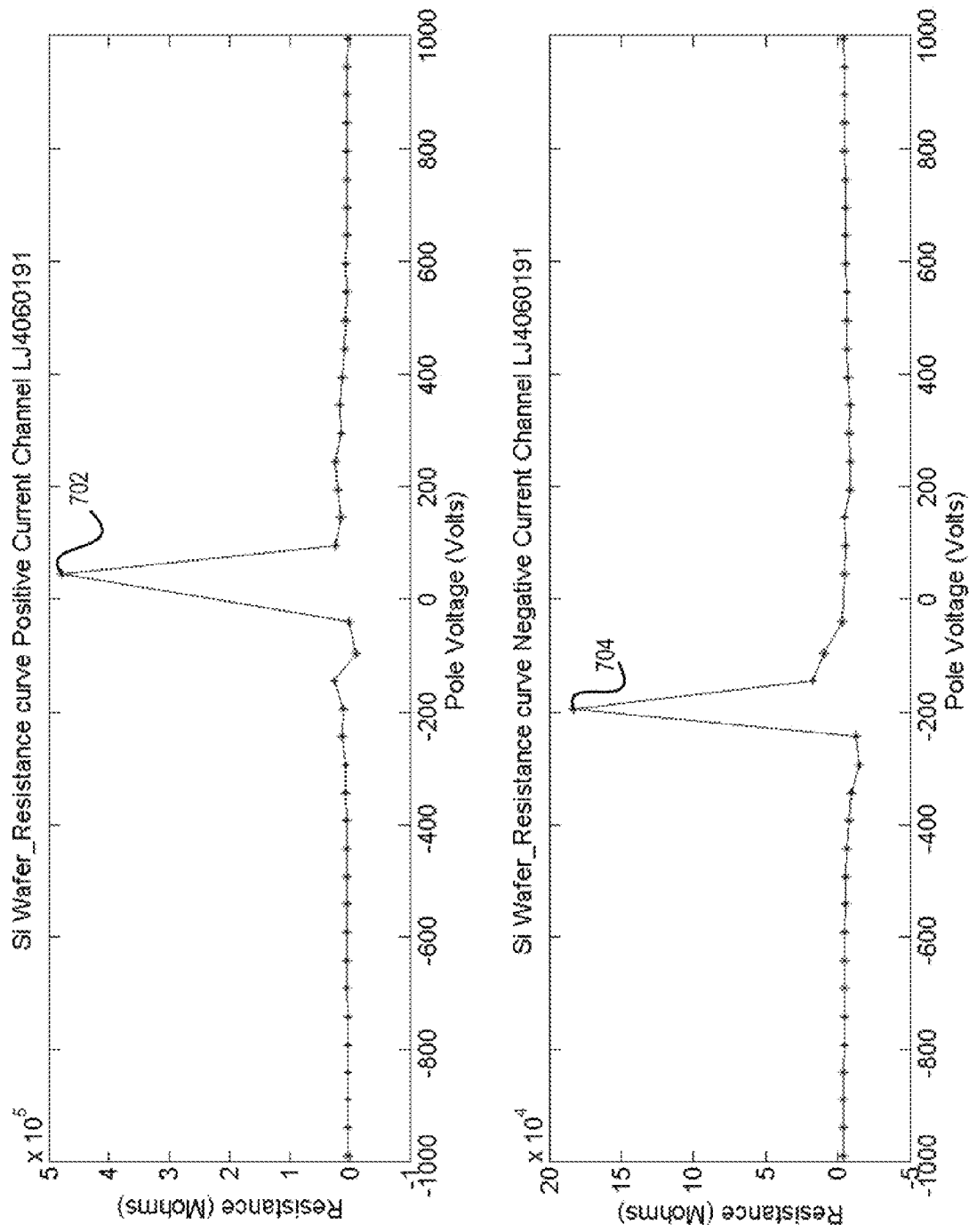
FIG. 7 shows, in an embodiment of the invention, simple resistance curves for each bias voltage set point.

FIG. 7 shows, in an embodiment, simple resistance curves for each bias voltage set point. Plot 702 shows the resistance curve of an inner pole of the lower electrode and plot 704 shows the resistance curve of an outer pole. As can be seen from the two plots, each pole may require different potential to clamp a substrate to the lower electrode. Thus, during dechucking different bias voltage may have to be applied at each of the pole in order to facilitate the removal of the electrostatic charge at the local area around each pole. As can be appreciated from the foregoing, even though FIG. 7 shows bias voltage, the same result can be extrapolated for bias current.

Figure 8:
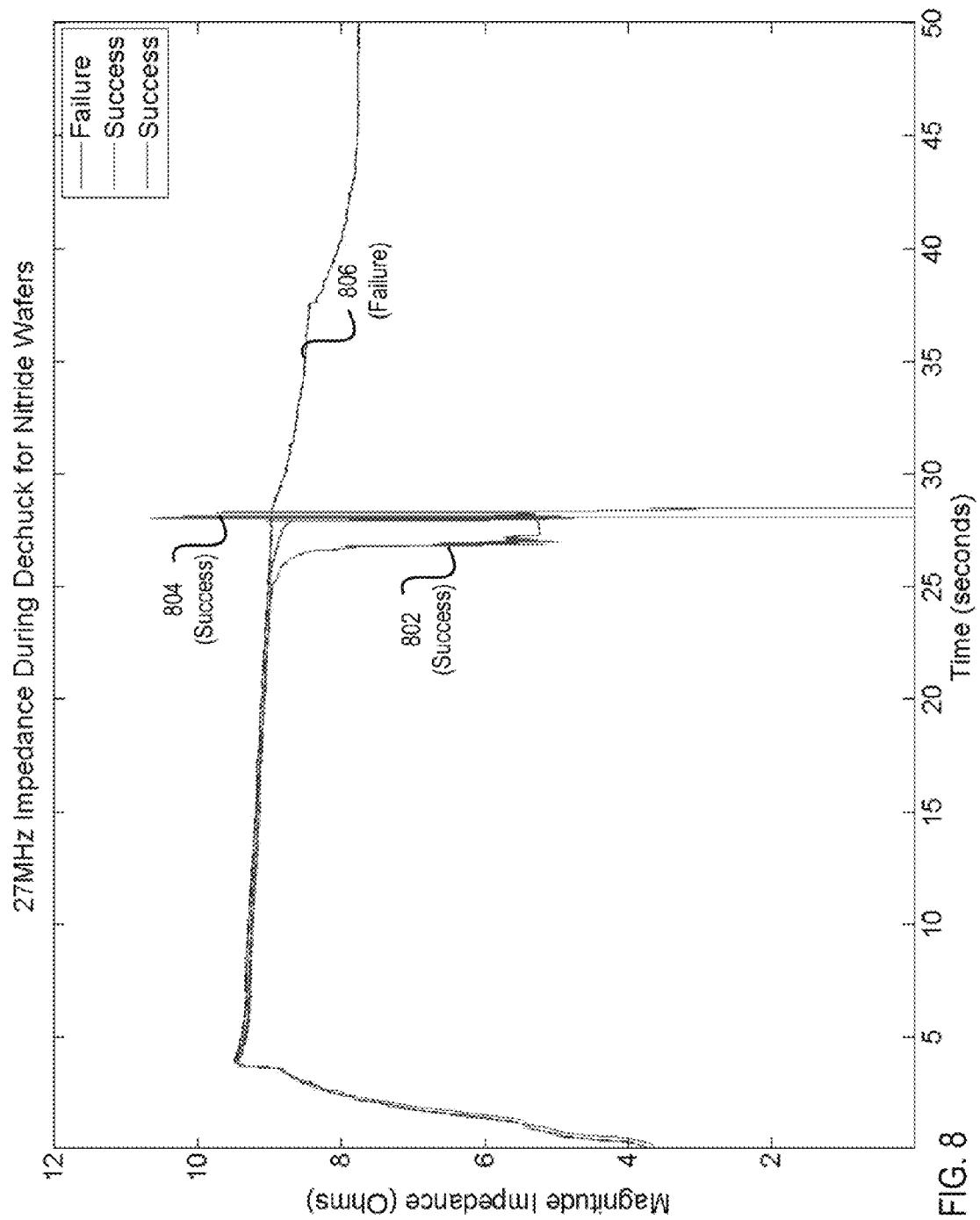
FIG. 8 shows, in an embodiment of the invention, a comparison between three dechuck sequences.

FIG. 8 shows, in an embodiment of the invention, a comparison between three dechuck sequences. Both plots 802 and 804 show a successful separation of the substrate from the lower electrode. However, plot 804 shows a more severe oscillation in the electrical signal (such as plasma impedance). As a result, more force may have been required to facilitate the separation. Thus, the substrate shown in plot 804 may have shifted away from its process center. By knowing the magnitude of the oscillation, corrective action may be taken to correct potential misalignment (for the substrate in plot 804).

As aforementioned, the application of mechanical forces (such as inert gas flow, raising the lifter pins, etc.) may aid in the separation of the substrate from the lower electrode. However, the mechanical force may not be uniformly applied. As a result, the substrate may bow upward as isolated regions of the substrate are hinged to the lower electrode. Plot 806 shows an example of a bow substrate. As can be seen from plot 806, the electrostatic charge on the substrate is not sufficiently discharged since the electrical signal (such as plasma impedance) does not show a significant perturbation as seen in plot 802 or plot 804. By monitoring electrical signals (such as the plasma impedance), corrective actions may be taken to facilitate the removal of the electrostatic charge.

Figure 9:
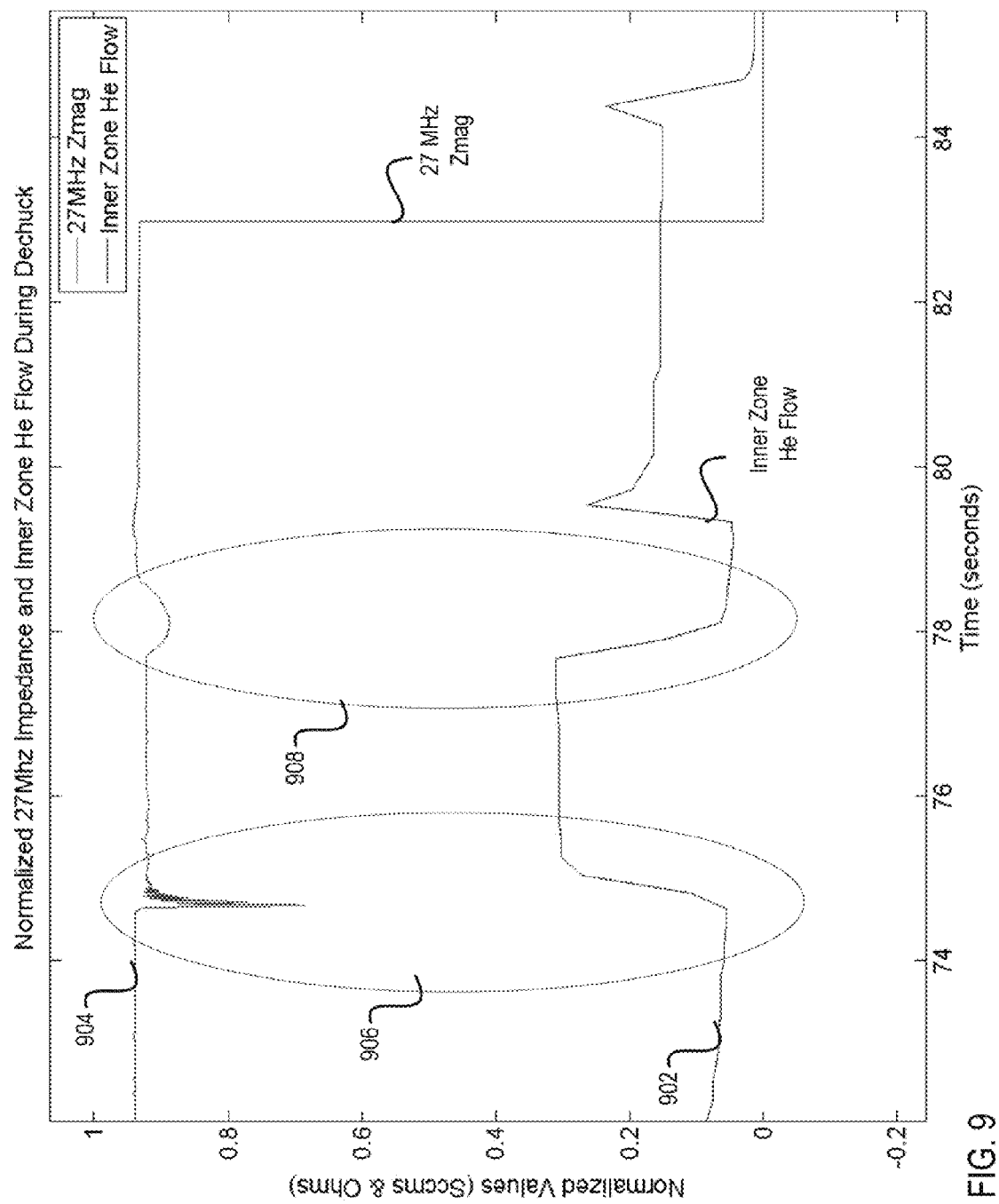
FIG. 9 shows, in an embodiment of the invention, a plot illustrate the relationship between substrate movement and electrical parameters.

FIG. 9 shows, in an embodiment of the invention, how substrate movement is reflected in the electrical parameters. In an example, as helium gas flow changes (plot 902), the electrical signal (such as plasma impedance) changes (as shown in plot 904). For example, at around 75 seconds (906), backside helium gas flow is applied to the substrate resulting in a physical perturbation to the substrate as the helium gas lifts the substrate from the lower electrode. At around the same time, an oscillation occurs in the plasma impedance (as shown in plot 904). Similarly, when the helium gas flow is turn off at around 78 seconds (908), plasma impedance reflects an oscillation even though the oscillation is comparatively less severe.

As can be appreciated from one or more embodiments of the present invention, methods are provided for optimizing the dechuck sequence. By monitoring both mechanical forces and electrical characteristics, the risk associated with separating a substrate from a lower electrode is significantly minimized, thereby reducing substrate waste. In addition, constant monitoring enables corrective actions to be applied to facilitate the dechuck sequence. As a result, a higher throughput yield may be achieved while minimizing risk to the substrate and the tool components (such as processing chamber components and robot arm).

While this invention has been described in terms of several preferred embodiments, there are alterations, permutations, and equivalents, which fall within the scope of this invention.

Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for optimizing a dechuck sequence, said dechuck sequence includes mechanically removing a substrate from a lower electrode in a processing chamber of a plasma processing system, comprising:
   turning off a clamp voltage;
   supplying inert gas to a backside of the substrate,
   before raising lifter pins, performing an initial analysis, wherein said initial analysis includes
      analyzing a first set of electrical characteristic data of a plasma, wherein said plasma is formed over said substrate during said dechuck sequence, and wherein said first set of electrical characteristic data is independent of force on the lifter pins,
      comparing said first set of electrical characteristic data against a set of electrical characteristic threshold values, and
      if said first set of electrical characteristic data traverses, by at least one of exceeding, falling below or remaining with a range of, said set of electrical characteristic threshold values, turning off the inert gas;
   raising the lifter pins from said lower electrode to move said substrate in an upward direction, wherein said lifter pins are not raised to a maximum height; and
   after raising the lifter pins, performing a mechanical and electrical analysis, wherein said mechanical and electrical analysis includes
      analyzing a first set of mechanical data, wherein said set of mechanical data includes an amount of force exerted by said lifter pins,
      analyzing a second set of electrical characteristic data,
      comparing said first set of mechanical data to a set of mechanical threshold values and said second set of electrical characteristic data to said set of electrical characteristic threshold values, and
      if said first set of mechanical data traverses, by at least one of exceeding, falling below or remaining with a range of, said set of mechanical threshold values and said second set of electrical characteristic data traverses said set of electrical characteristic threshold values, removing said substrate from said lower electrode since a substrate-released event has occurred.

2. The method of claim 1 further including performing, if said first set of electrical characteristic data does not traverse, by at least one of exceeding, falling below or remaining with a range of, said set of electrical characteristic threshold values during said initial analysis,
   comparing current time for performing said dechuck sequence against a first time threshold value,
   if said current time for said performing of said dechuck sequence is greater than said first time threshold value, adjusting said inert gas, and
   repeating said initial analysis.

3. The method of claim 1 further including performing, if said first set of electrical characteristic data does not traverse, by at least one of exceeding, falling below or remaining with a range of, said set of electrical characteristic threshold values during said initial analysis,
    comparing current time for performing of said dechuck sequence against a first time threshold value,
    if said current time for said performing of said dechuck sequence is not greater than said first time threshold value, turning off said inert gas provided in said processing chamber.

4. The method of claim 1 further including performing, if at least one of said first set of mechanical data does not traverse said set of mechanical threshold values and said second set of electrical characteristic data does not traverse, by at least one of exceeding, falling below or remaining with a range of, said set of electrical characteristic threshold values,
    comparing current time for performing of said dechuck sequence against a second time threshold value,
    if said current time for said performing of said dechuck sequence is greater than said second time threshold value, applying corrective action, and
    repeating said mechanical and electrical analysis.

5. The method of claim 4 wherein said corrective action includes increasing said inert gas pressure.

6. The method of claim 4 wherein said corrective action includes increasing said force exerted by said lifter pins.

7. The method of claim 4 wherein said corrective action includes applying at least one of bias voltage and bias current of a reverse polarity to said lower electrode.

8. The method of claim 4 wherein said corrective action is not applied uniformly across said substrate surface.

9. The method of claim 1 further including performing, if at least one of said first set of mechanical data does not traverse, by at least one of exceeding, falling below or remaining with a range of, said set of mechanical threshold values and said second set of electrical characteristic data does not traverse said set of electrical characteristic threshold values,
    comparing current time for performing of said dechuck sequence against a second time threshold value, and
    if said current time for said performing of said dechuck sequence is not greater than said second time threshold value, applying emergency procedure to remove said substrate from said lower electrode.

10. The method of claim 9 wherein said emergency procedure includes sending an alarm notification.

11. The method of claim 9 wherein said emergency procedure includes exerting a high level of force to said lifter pins to separate said substrate from said lower electrode.

12. The method of claim 1 wherein said set of electrical characteristics includes plasma impedance.

13. The method of claim 1 wherein said set of electrical characteristics includes direct current bias voltage.

14. The method of claim 1 wherein said set of electrical characteristics includes current generator power.

15. The method of claim 1 wherein said set of electrical characteristics is a single electrical parameter, wherein said single electrical parameter has been empirically determined to exhibit the greatest change when a test substrate exhibits physical perturbations during said dechuck sequence that cause oscillations in the plasma.

16. The method of claim 1 wherein said set of electrical characteristics includes more than a single electrical parameter, wherein a combination of electrical parameters is compared against a plurality of threshold values to determine said substrate-released event.

17. The method of claim 1 wherein analysis and comparison are performed by a tool controller.

18. The method of claim 1 wherein said inert gas is helium.

19. An article of manufacture comprising a non-transitory program storage medium having computer readable code embodied therein, said computer readable code being configured for optimizing a dechuck sequence, in which said dechuck sequence includes mechanically removing a substrate from a lower electrode in a processing chamber of a plasma processing system, comprising:
    code for turning off a clamp voltage;
    code for supplying inert gas to a backside of the substrate;
    code for performing an initial analysis, wherein said initial analysis includes
        code for analyzing a first set of electrical characteristic data of a plasma sampled before raising lifter pins, wherein said plasma is formed over said substrate during said dechuck sequence, and wherein said first set of characteristic data is independent of force on the lifter pins,
        code for comparing said first set of electrical characteristic data against a set of electrical characteristic threshold values, and
        code for turning of said inert gas provided in said plasma processing chamber if said first set of electrical characteristic data traverses, by at least one of exceeding, falling below or remaining with a range of, said set of electrical characteristic threshold values;
    code for raising the lifter pins from said lower electrode to move said substrate in an upward direction, wherein said lifter pins are not raised to a maximum height; and
    code for performing a mechanical and electrical analysis after raising the lifter pins, wherein said mechanical and electrical analysis includes
        code for analyzing a first set of mechanical data, wherein said set of mechanical data includes the amount of force exerted by said lifter pins,
        code for analyzing a second set of electrical characteristic data,
        code for comparing said first set of mechanical data to a set of mechanical threshold values and said second set of electrical characteristic data to said set of electrical characteristic threshold values, and
        code for removing said substrate from said lower electrode if said first set of mechanical data traverses, by at least one of exceeding, falling below or remaining with a range of, said set of mechanical threshold values and said second set of electrical characteristic data traverses said set of electrical characteristic threshold values, since said substrate-released event has occurred.

20. The article of manufacturing of claim 19 further performing, including if at least one of said first set of mechanical data does not traverse, by at least one of exceeding, falling below or remaining with a range of, said set of mechanical threshold values and said second set of electrical characteristic data does not traverse, by at least one of exceeding, falling below or remaining with a range of, said set of electrical characteristic threshold values,
    code for comparing current time for performing said dechuck sequence against a second time threshold value,
    code for applying corrective actions if said current time for performing said dechuck sequence is greater than said second time threshold value, and
    code for repeating said mechanical and electrical analysis.

* * * * *

UNITED STATES PATENT AND TRADEMARK OFFICE
CERTIFICATE OF CORRECTION

| | | |
|---|---|---|
| PATENT NO. | : 8,797,705 B2 | Page 1 of 1 |
| APPLICATION NO. | : 12/557387 | |
| DATED | : August 5, 2014 | |
| INVENTOR(S) | : John C. Valcore, Jr. | |

It is certified that error appears in the above-identified patent and that said Letters Patent is hereby corrected as shown below:

In the Specification,
Detailed Description Of Embodiments,

Column 7, Line 50:   Delete "off" and insert --off.--

Column 8, Line 9:   Delete "or" and insert --of--

Column 8, Line 62:   Delete "lifer" and insert --lifter--

Column 9, Line 29:   Delete "108." and insert --120.--

In the Claims,

Column 12, Claim 1,
Line 23:   Delete "substrate," and insert --substrate;--

Signed and Sealed this
Third Day of February, 2015

Michelle K. Lee
*Deputy Director of the United States Patent and Trademark Office*